United States Patent [19]
Jung

[11] Patent Number: 5,985,744
[45] Date of Patent: Nov. 16, 1999

[54] FORMING A SILICIDE IN PREDETERMINED AREAS OF A SEMICONDUCTOR DEVICE

[75] Inventor: Jong Wan Jung, Daejeon-Si, Rep. of Korea

[73] Assignee: LG Semicon Co., Ltd., Chungcheongbuk-Do, Rep. of Korea

[21] Appl. No.: 08/964,913

[22] Filed: Nov. 5, 1997

[30] Foreign Application Priority Data

Mar. 17, 1997 [KR] Rep. of Korea .......................... 97/8973

[51] Int. Cl.⁶ ................................................ H01L 21/3205
[52] U.S. Cl. .......................... 438/587; 438/592; 438/595; 438/649
[58] Field of Search ..................................... 438/587, 595, 438/648, 649, 660, 682, 683, 685, 592

[56] References Cited

U.S. PATENT DOCUMENTS

| | | |
|---|---|---|
| 4,478,679 | 10/1984 | Chang et al. . |
| 4,563,805 | 1/1986 | Scovell et al. . |
| 5,240,872 | 8/1993 | Motonami et al. . |
| 5,338,702 | 8/1994 | Kobeda et al. . |
| 5,589,417 | 12/1996 | Jeng . |
| 5,635,426 | 6/1997 | Hayashi et al. . |
| 5,736,421 | 4/1998 | Shimomura et al. . |
| 5,766,991 | 6/1998 | Chen . |

OTHER PUBLICATIONS

Wolf, S., "Silicon Processing for the VLSI Era Vol. 2—Process Integration" pp. 147–152, 1990.

*Primary Examiner*—John F. Niebling
*Assistant Examiner*—Jonathan Hack
*Attorney, Agent, or Firm*—Morgan, Lewis & Bockius LLP

[57] ABSTRACT

A method for fabricating a semiconductor device includes forming a plurality of field oxide layers on a semiconductor substrate to define an active region; forming a plurality of gate electrodes each having sidewall spacers on the active region of the semiconductor substrate, depositing a metal layer on the semiconductor substrate including the plurality of gate electrodes, defining a first region and a second region, removing the metal layer over the second region, and forming a silicide layer on the gate electrode and on the semiconductor substrate over the first region with a first annealing process.

18 Claims, 3 Drawing Sheets

5,985,744

1

FORMING A SILICIDE IN PREDETERMINED AREAS OF A SEMICONDUCTOR DEVICE

This application claims the benefit of Korean Application No. 8973/1997 filed on Mar. 17, 1997, which is hereby incorporated by reference.

BACKGROUND OF THE INVENTION

1. Field of the Invention

The present invention relates to a semiconductor device, and more particularly, to a method for fabricating a semiconductor device with reduced contact resistance and improved performance.

2. Discussion of the Related Art

FIGS. 1A to 1D are cross-sectional views showing process steps of a conventional method for fabricating a semiconductor device.

Referring initially to FIG. 1A, a plurality of field oxide layers 12 are formed on the surface of a semiconductor substrate 11 with a local oxidation of silicon (LOCOS) process. A buffer oxide layer 13 is grown on active regions which are defined by the field oxide layers 12, and a polysilicon layer is then formed on the entire surface of the semiconductor substrate 11 including the field oxide layers 12. Subsequently, a photoresist film (not shown) is coated on the polysilicon layer and patterned by an exposure and development process. Next, using the photoresist pattern as a mask, the polysilicon layer is selectively patterned to form gate electrodes 14. Thereafter, an insulating layer is formed on the entire surface of the semiconductor substrate 11 including the gate electrodes 14 and then is etched back to form sidewall spacers 15 on both sides of each of the gate electrodes 14. A high-temperature low-pressure dielectric (HLD) layer 16 is deposited on the entire surface of the semiconductor substrate 11 including the gate electrodes 14. The HLD layer 16 is then selectively removed with an etching process to expose a portion of the semiconductor substrate 11 (with the buffer oxide layer 13 o thereon) and the gate electrode 14.

Referring to FIG. 1B, a Titanium (Ti) layer 17 is formed on the entire surface including the semiconductor substrate 11 and the gate electrodes 14.

Then, an annealing process is executed to form a silicide layer 17a on the gate electrode 14 and on the semiconductor substrate 11 at both sides of the gate electrode 14, as shown in FIG. 1C. In this case, the silicide layer 17a is not formed on the surface of the sidewall spacers 15 and on the HLD layer 16. The silicide layer 17a formed at both sides of the gate electrode 14 is used as source and drain electrodes.

Referring finally to FIG. 1D, the Ti layer 17 where the silicide layer 17a has not been formed is removed to complete the process steps of the conventional meth od for fabricating a semiconductor device.

Since the semiconductor substrate 11 and the gate electrode 14 contain silicon, the silicide layer is formed at interface between the Ti layer 17 and the semiconductor substrate 11 and the gate electrode 14. In contrast, the silicide layer is not formed at other portions.

The above-described conventional method has the following problems.

First, when etching the HLD film, the field oxide layer can be easily damaged. This increases the junction leakage current and affects the device performance.

Second, although the silicide layer is formed after selectively removing the HLD layer, the silicide layer is

2 restrained by $O_2$ in etching the HLD layer. Thus, the contact resistance and the sheet resistance are increased.

Third, the step coverage between the silicide layer and the HLD layer is very uneven. As a result, planarization becomes inferior throughout the fabrication process.

SUMMERY OF THE INVENTION

Therefore, the present invention is directed to a method for fabricating a semiconductor device that substantially obviates one or more of problems due to limitations and disadvantages of the related art.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

An object of the invention is to provide a method for fabricating a semiconductor device in which a protection dielectric film is not used in a self-aligned silicide (Salicide) process so that the increase of a contact resistance and the damage of a field oxide layer caused by the protection dielectric film are prevented.

To achieve these and other advantages and in accordance with the purpose of the present invention, as embodied and broadly described, the method for fabricating a semiconductor device includes the steps of forming a plurality of gate electrodes each having sidewall spacers on an active region of a semiconductor substrate on which a plurality of field oxide layers are formed, depositing a metal layer on the entire surface including the gate electrodes, dividing the semiconductor substrate into first and second regions and removing the metal layer over the second region, and forming a silicide layer on the gate electrode and on surface of the semiconductor substrate over the first region with an annealing process.

In another aspect, a method for fabricating a semiconductor device on a semiconductor substrate, the semiconductor substrate having an active region defined by a plurality of field oxide layers, the method including the steps of forming a plurality of gate electrodes having sidewall spacers on the active region of the semiconductor substrate, depositing a metal layer on the semiconductor substrate including the plurality of gate electrodes, removing the metal layer over a selected region, and forming a silicide layer on the gate electrode and on the semiconductor substrate with an annealing process, the silicide layer being formed where the metal layer is not removed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 2A to 2E are cross-sectional views showing process steps of a method for fabricating a semiconductor device according to the present invention.

Figure 1A:
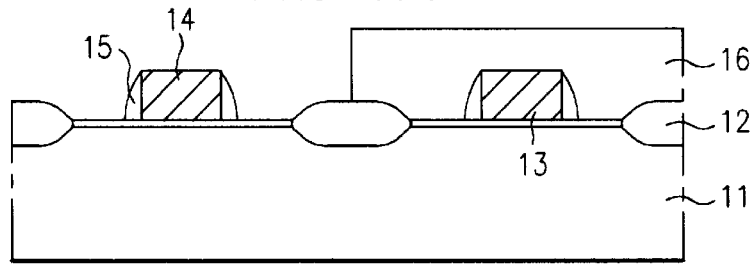
FIGS. 1A to 1D are cross-sectional views showing process steps of a conventional method for fabricating a semiconductor device.
Figure 1B:
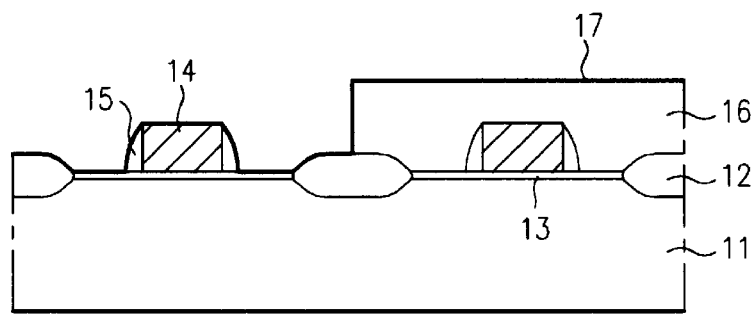
Figure 1C:
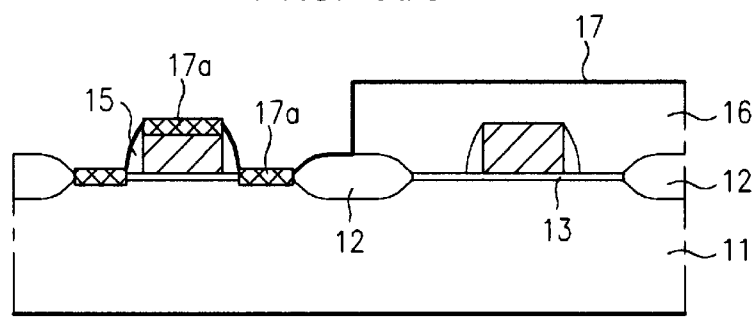
Figure 1D:
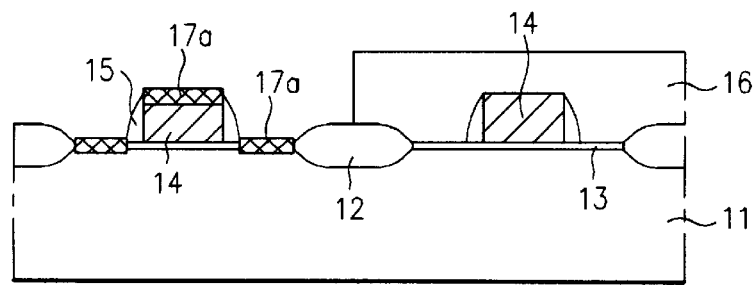
Figure 2A:
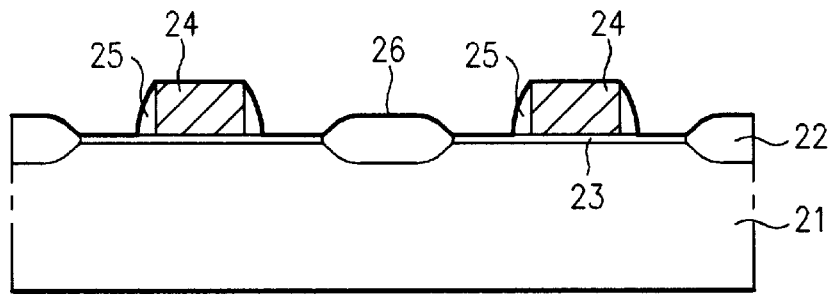
FIGS. 2A to 2E are cross-sectional views showing process steps of a method for fabricating a semiconductor device according to a preferred embodiment of the present invention.

Referring initially to FIG. 2A, a plurality of field oxide layers 22 are formed on the semiconductor substrate 21 to define active regions. A buffer oxide layer 23, which functions as a first insulating layer, is formed on the semiconductor substrate 21 of the active regions. Subsequently, a polysilicon layer is formed on the semiconductor substrate 21 including the field oxide layers 22. Next, a photoresist film (not shown) is coated on the polysilicon layer and patterned by an exposure and development process. Using the photoresist pattern as a mask, the polysilicon layer is selectively etched to form a plurality of gate electrodes 24. Subsequently, a second insulating layer is deposited on the entire surface of the semiconductor substrate 21 including the gate electrodes 24 and then is etched back to form sidewall spacers 25 on both sides of each of the gate electrodes 24. A Ti layer 26, which is to be used for forming a silicide layer, is deposited on the entire surface of the semiconductor substrate 21 including the gate electrodes 24. In this case, either cobalt (Co) or tungsten (W) can be used instead of titanium (Ti).

Figure 2B:
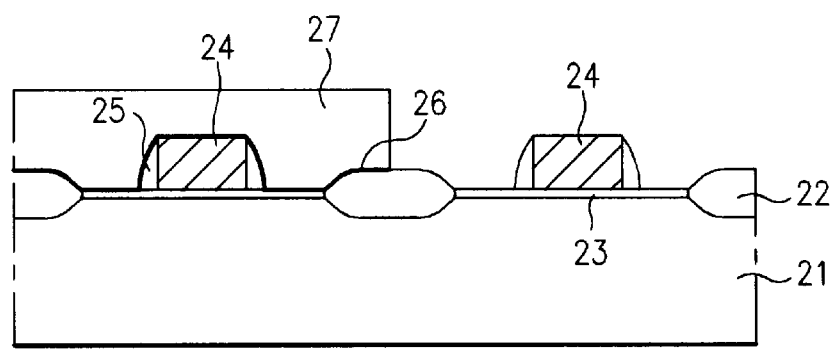

Referring to FIG. 2B, a photoresist film 27 is coated on the entire surface of the semiconductor substrate 21 and then patterned by an exposure and development process so that an area where a silicide layer will be formed is masked. In other words, the photoresist film 27 over the area where a silicide layer is to be formed is not removed and the photoresist film 27 over the other area is removed.

Figure 2C:
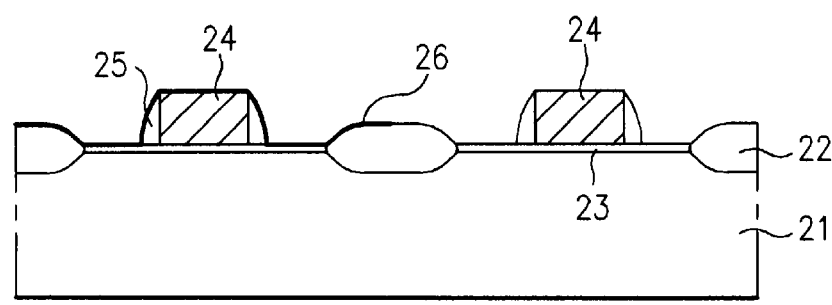

Referring to FIG. 2C, the exposed Ti layer 26 is removed with an etching process. In this case, either a dry etch or a wet etch process can be used to remove the Ti layer 26. The etchant used for wet etch is preferably $NH_4OH:H_2O_2:H_2O$.

Figure 2D:
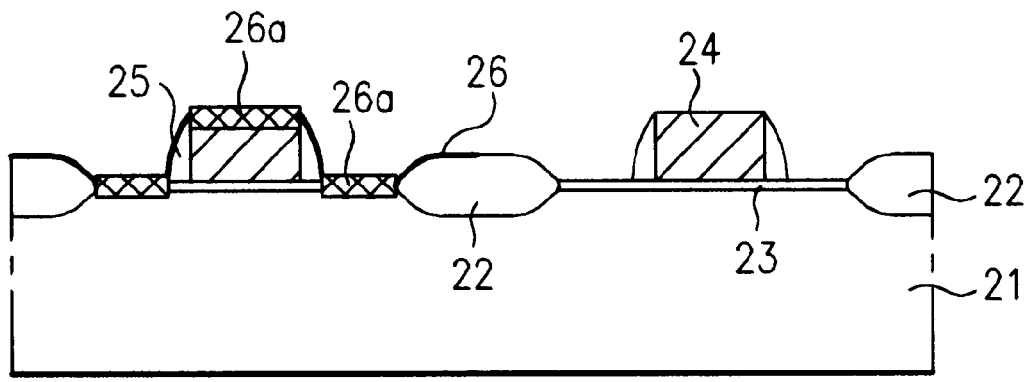

Referring to FIG. 2D, the remaining photoresist film 27 is removed. A first annealing process is performed to form a silicide layer 26a on the gate electrode 24 and on the semiconductor substrate 21 at both sides of the gate electrode 24. Here, the silicide layer 26a formed on the semiconductor substrate 21 at both sides of the gate electrode 21 is used as source and drain electrodes.

Figure 2E:
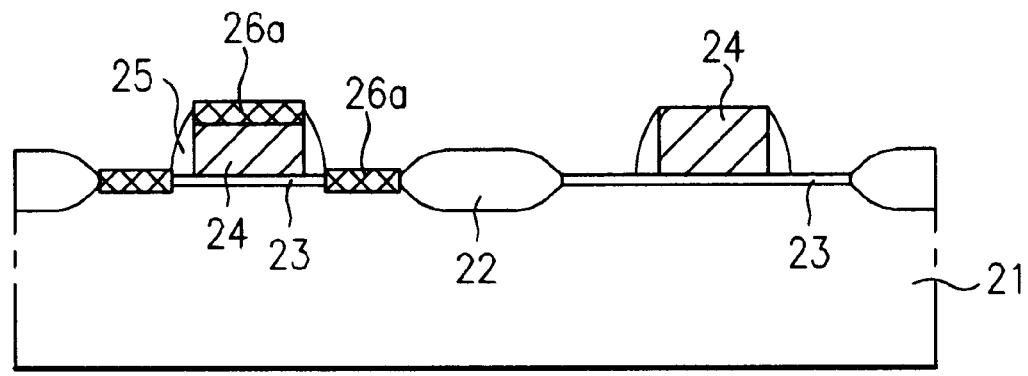

Referring finally to FIG. 2E, the Ti layer 26 where a silicide layer has not been formed is removed. Then, a second annealing is performed, thus completing the process steps for fabricating a semiconductor device according to the present invention.

The above-described method for fabricating a semiconductor device has the following advantages.

First, since an HLD layer is not used, the corresponding etch process to remove the HLD layer is not required. Thus, this prevents damage to the field oxide layers. As a results the junction leakage current is eliminated and the performance of the device is improved.

Second, factors restraining the formation of silicide are eliminated. Consequently, a silicide layer with good reliability can be formed.

Third, since the HLD layer is not used, there is no additional step coverage generated between the silicide region and other regions.

It will be apparent to those skilled in the art that various modification and variations can be made in the method for fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device comprising the steps of:

forming a plurality of field oxide layers on a semiconductor substrate to define an active region;

forming a plurality of gate electrodes each having sidewall spacers on the active region of the semiconductor substrate;

depositing a metal layer on the semiconductor substrate including the plurality of gate electrodes;

defining a first region and a second region;

removing the metal layer over the second region; and thereafter forming a silicide layer on gate electrodes and on the semiconductor substrate over the first region with a first annealing process.

2. The method as claimed in claim 1, wherein the metal layer includes a titanium layer.

3. The method as claimed in claim 1, after the step of forming a silicide layer, further comprising the step of removing the metal layer where the silicide layer is not formed.

4. The method as claimed in claim 3, after removing the metal layer where the silicide layer is not formed, further comprising the step of performing a second annealing process.

5. The method as claimed in claim 1, wherein the step of defining a first region and a second region includes the steps of:

coating a photoresist film on the semiconductor substrate including the plurality of gate electrodes; and selectively removing the photoresist film with an exposure and development process, so that where the photoresist film remains becomes the first region and where the photoresist film is removed becomes the second region.

6. The method as claimed in claim 1, wherein the step of removing the metal layer is carried out by a wet etch process.

7. The method as claimed in claim 6, wherein the wet etch process uses an etchant of $NH_4OH:H_2O_2:H_2O$.

8. The method as claimed in claim 1, wherein the metal layer includes one of cobalt and tungsten.

9. The method as claimed in claim 1, wherein the step of forming the plurality of gate electrodes includes the steps of:

forming a buffer layer on the semiconductor substrate of the active regions;

forming a polysilicon layer on the buffer layer; and selectively removing the polysilicon layer to form the plurality of gate electrodes.

10. A method for fabricating a semiconductor device on a semiconductor substrate, the semiconductor substrate having an active region defined by a plurality of field oxide layers, the method comprising the steps of:

forming a plurality of gate electrodes having sidewall spacers on the active region of the semiconductor substrate;

depositing a metal layer on the semiconductor substrate including the plurality of gate electrodes;

removing the metal layer over a selected region; and thereafter forming a silicide layer on gate electrodes and on the semiconductor substrate where the metal layer is not removed, the silicide layer being formed with an annealing process.

11. The method as claimed in claim 10, wherein the metal layer includes one of titanium, cobalt and tungsten.

12. The method as claimed in claim 10, wherein the step of removing the metal layer over a selected region includes the steps of:

coating a photoresist film on the semiconductor substrate including the plurality of gate electrodes; and selectively removing the photoresist film with an exposure and development process; and removing the metal layer using the photoresist film as a mask, by one of a wet etch process and a dry etch process.

13. A method as claimed in claim 12, wherein the wet etch process uses an etchant of $NH_4OH:H_2O_2:H_2O$.

14. A method for fabricating a semiconductor device, comprising the steps of:

defining first and second regions on a semiconductor substrate;

forming first and second gates having insulating sidewall spacers on the first and second regions, respectively;

forming a metal layer only on the first region and the first gate; and annealing the metal layer to form a silicide layer on a surface of the first region and first gate.

15. The method as claimed in claim 14, wherein the metal layer includes one of titanium, cobalt and tungsten.

16. The method as claimed in claim 14, wherein the silicide layer is not formed on the insulating sidewall spacers.

17. The method as claimed in claim 14, after annealing the metal layer, further comprising the step of removing the metal layer where the silicide layer is not formed.

18. The method as claimed in claim 17, wherein the step of removing the metal layer is carrier out by a wet etch process.

* * * * *